United States Patent
Reboud et al.

(10) Patent No.: US 11,165,225 B2
(45) Date of Patent: Nov. 2, 2021

(54) OPTOELECTRONIC DEVICE COMPRISING A CENTRAL SEGMENT TENSILELY STRAINED ALONG A FIRST AXIS AND ELECTRICALLY BIASED ALONG A SECOND AXIS

(71) Applicant: Commissariat a l'Energie Atomique et aux Energies Alternatives, Paris (FR)

(72) Inventors: Vincent Reboud, Grenoble (FR); Mathieu Bertrand, Grenoble (FR); Nicolas Pauc, Grenoble (FR); Alexei Tchelnokov, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 16/866,630

(22) Filed: May 5, 2020

(65) Prior Publication Data
US 2020/0358254 A1    Nov. 12, 2020

(30) Foreign Application Priority Data
May 9, 2019    (FR) ...................................... 19 04820

(51) Int. Cl.
*H01S 5/32*        (2006.01)
*H01L 31/0232*     (2014.01)
*H01L 31/028*      (2006.01)
*H01L 31/0352*     (2006.01)
*H01L 33/10*       (2010.01)
(Continued)

(52) U.S. Cl.
CPC .......... *H01S 5/3201* (2013.01); *H01L 31/028* (2013.01); *H01L 31/0232* (2013.01);
(Continued)

(58) Field of Classification Search
CPC ...... H01S 5/3201; H01S 5/0651; H01S 5/125; H01S 5/3027; H01S 5/06236;
(Continued)

(56) References Cited

U.S. PATENT DOCUMENTS

2003/0168659 A1*  9/2003  Lal ...................... B81C 1/00666
                                                        257/49
2010/0081227 A1*  4/2010  Hong ...................... H01L 33/34
                                                         438/47
(Continued)

FOREIGN PATENT DOCUMENTS

EP    2 960 203 A1    12/2015
EP    3 447 549 A1    2/2019

OTHER PUBLICATIONS

French Preliminary Search Report dated Jan. 22, 2020 in French Application 19 04820 filed May 9, 2019 (with English Translation of Categories of Cited Documents and Written Opinion), 5 pages.
(Continued)

*Primary Examiner* — Sitaramarao S Yechuri
(74) *Attorney, Agent, or Firm* — Oblon, McClelland, Maier & Neustadt, L.L.P (57) ABSTRACT

An optoelectronic device including a semiconductor layer formed from a central segment and at least two lateral segments forming tensioning arms that extend along a longitudinal axis A1. The semiconductor layer furthermore includes at least two lateral segments forming electrical biasing arms that extend along a transverse axis A2 orthogonal to the axis A1.

9 Claims, 7 Drawing Sheets

(51) Int. Cl.
*H01L 33/20* (2010.01)
*H01L 33/34* (2010.01)
*H01S 5/065* (2006.01)
*H01S 5/125* (2006.01)
*H01S 5/30* (2006.01)

(52) U.S. Cl.
CPC ...... *H01L 31/03529* (2013.01); *H01L 33/105* (2013.01); *H01L 33/20* (2013.01); *H01L 33/34* (2013.01); *H01S 5/0651* (2013.01); *H01S 5/125* (2013.01); *H01S 5/3027* (2013.01)

(58) Field of Classification Search
CPC .. H01S 5/1234; H01S 5/04254; H01S 5/0424; H01S 5/04257; H01L 31/0232; H01L 31/028; H01L 31/03529; H01L 33/105; H01L 33/20; H01L 33/34; H01L 33/10
See application file for complete search history.

(56) References Cited

U.S. PATENT DOCUMENTS

2016/0301189 A1\* 10/2016 Cable .................. H01S 5/0683
2019/0067904 A1  2/2019 Reboud et al.

OTHER PUBLICATIONS

Jiang, J. et al., "Strain-Induced Enhancement of Electroluminescence from Highly Strained Germanium Light-Emitting Diodes," ACS Photonics, vol. 6, 2019, pp. 915-923, XP055655555.

Petykiemicz, J. et al., "Direct Bandgap Light Emission from Strained Ge Nanowires Coupled with High-Q Optical Cavities," arXiv:1508.01255v1 [physics.optics], Aug. 6, 2015, 17 pages (with Supplemental Material).

\* cited by examiner

Fig.7C

OPTOELECTRONIC DEVICE COMPRISING A CENTRAL SEGMENT TENSILELY STRAINED ALONG A FIRST AXIS AND ELECTRICALLY BIASED ALONG A SECOND AXIS

TECHNICAL FIELD

The field of the invention is that of optoelectronic devices for emitting or detecting light radiation, such as laser diodes, light-emitting diodes and photodiodes, comprising a central segment that is strained by tensioning arms. The invention is applicable to photonic integrated circuits, notably in the context of the technology referred to as silicon photonics.

PRIOR ART

In various microelectronic or optoelectronic applications, it may be advantageous to use a semiconductor layer made of a crystalline, and preferably single-crystal, material presenting locally a tensile mechanical strain. This is notably the case with certain light sources the optical gain medium of which has, unstrained, an indirect electronic band structure, the band structure then being made direct by applying a sufficient tensile strain. The crystalline semiconductor may be a material based on germanium, and may for example be germanium, germanium-tin, or even silicon-germanium.

The article by Petykiewicz et al. entitled *Direct Bandgap Light Emission from Strained Ge Nanowires*, Nano Lett., 2016, 16 (4), 2168-2173, describes an example of a laser source comprising a semiconductor layer based on germanium, the semiconductor layer being structured to form a membrane that is suspended above a carrier layer. The suspended membrane comprises an elongate central segment that is placed under tension along its longitudinal axis by lateral segments that form tensioning arms. The central segment comprises an active region, here the gain medium of the laser source. This active region is located in an optical cavity defined by two Bragg mirrors, which are placed in the tensioning arms and are formed by a periodic succession of localized etches of the semiconductor layer. The light emission is here obtained by optical pumping of the gain medium.

Figure 1:
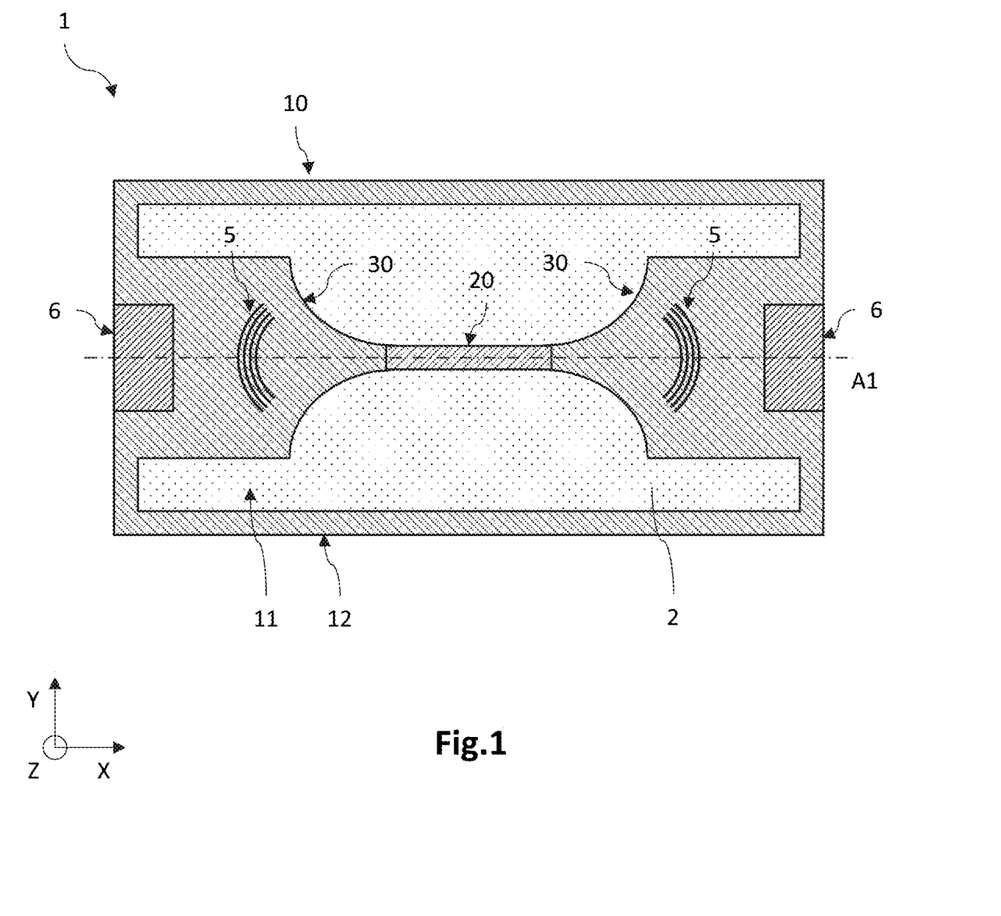
FIG. 1, which has already been described, is a schematic and partial view from above of an example of an optoelectronic device for emitting coherent light, in which device the electrical pumping of the active region (gain medium) is performed by way of the tensioning arms.

FIG. 1 illustrates an example of an optoelectronic device 1 similar to that described in the article by Petykiewicz et al. 2016 but in which the gain medium (active region) is pumped electrically. The structured portion 11 (suspended membrane) of the semiconductor layer 10 thus comprises an elongate central segment 20 that is placed under tension along the longitudinal axis A1 by tensioning arms 30. The tensioning arms 30 and the central segment 20 therefore form the structured portion 11 of the semiconductor layer, which is suspended above a carrier layer 2 and linked to a peripheral portion 12 of the semiconductor layer. The optical cavity is defined by Bragg mirrors 5 located in the tensioning arms 30, and is therefore oriented along the longitudinal axis A1. Moreover, with the aim of performing the electrical pumping of the gain medium, the tensioning arms 30 make electrical contact with the connection pads 6 that allow the gain medium to be biased electrically, and hence the charge carriers are injected into the central segment 20 from the connection pads via the tensioning arms 30.

However, there is a need to provide an identical or similar optoelectronic device the optical and/or electronic properties of which are optimized. Moreover, it would appear that the optical and/or electronic properties of such an optoelectronic device notably depend on those of the active region located in the central segment, which properties may be impacted by the type of process used to fabricate the optoelectronic device employed. Thus, there is a need to provide such an optoelectronic device the optical and/or electronic properties of which are less dependent on the type of fabrication process employed.

SUMMARY OF THE INVENTION

One objective of the invention is to at least partially remedy the drawbacks of the prior art, and more particularly to provide an optoelectronic device comprising an elongate central segment, which segment is placed under tension by tensioning arms, and the optical and/or electronic properties of which are optimized. Another objective of the invention is to provide an optoelectronic device the elongate central segment of which comprises an electrically biased active region the electrical bias of which is substantially uniform along the longitudinal axis of the central segment.

To this end, the subject of the invention is an optoelectronic device comprising a semiconductor layer based on a crystalline semiconductor, which comprises: a central segment, which has a shape that is elongate along a longitudinal axis, is tensilely strained along the longitudinal axis, and which comprises an active region for emitting or detecting light radiation; and at least two first lateral segments forming tensioning arms, which are opposite one another with respect to the central segment along the longitudinal axis and extend from the central segment, and which have an average width larger than an average width of the central segment, so as to tensilely strain the central segment along the longitudinal axis; and at least two connection pads, which are suitable for applying an electrical bias to the central segment.

According to the invention, the semiconductor layer furthermore comprises at least two second lateral segments forming biasing arms, which are opposite one another with respect to the central segment along a transverse axis oriented orthogonally to the longitudinal axis and extend from the central segment, each being formed: from a main portion, which makes electrical contact with one of the connection pads, the main portions of the biasing arms being doped opposite conductivity types; and from a plurality of joining portions, which link the main portion to the central segment.

The following are certain preferred but non-limiting aspects of this optoelectronic device.

The crystalline semiconductor in the tensioning arms is preferably intrinsic.

The optoelectronic device may be suitable for emitting light radiation at a wavelength Δ. The joining portions may be arranged along the longitudinal axis periodically, the period p of the arrangement of the joining portions along the longitudinal axis being shorter than the wavelength Δ.

A ratio of the width of the joining portions along the longitudinal axis to a distance separating two adjacent joining portions along the longitudinal axis, and the ratio of the period p to the wavelength Δ, may be such that the joining portions form optical reflectors defining an optical cavity with respect to an optical mode of wavelength Δ supported by the central segment.

The joining portions may have a curved junction with the central segment, with a radius of curvature equal, to within 10%, to half a distance separating two adjacent joining portions along the longitudinal axis.

The biasing arms may each comprise: a continuous portion, which is separate from the central segment, extends longitudinally along the longitudinal axis and links the joining portions to one another; and at least one intermediate portion linking the main portion to the continuous portion, the intermediate portion having a length and a width smaller than those of the corresponding main portion, so that the biasing arms induce in the central segment a tensile strain oriented along the transverse axis.

The central segment may have a direct electronic band structure.

The semiconductor layer may be based on germanium.

The connection pads may rest on and in contact with the main portions of the biasing arms.

The semiconductor layer may comprise a portion called the structured portion and a portion called the peripheral portion, the structured portion being formed from the central segment, from the tensioning arms and from the biasing arms, the structured portion being a membrane that is suspended above a carrier layer, or that makes contact with the carrier layer while being distinct therefrom in a plane parallel to the carrier layer.

The semiconductor layer may comprise through-trenches lying between the connection pads and the peripheral portion.

BRIEF DESCRIPTION OF THE DRAWINGS

Other aspects, aims, advantages and features of the invention will become more clearly apparent on reading the following detailed description of preferred embodiments thereof, which description is given by way of non-limiting example with reference to the appended drawings, in which.

DETAILED DESCRIPTION OF PARTICULAR EMBODIMENTS

In the figures and in the rest of the description, the same references will be used to refer to elements that are identical or similar. In addition, the various elements are not shown to scale for the sake of clarity of the figures. Moreover, the various embodiments and variants are not exclusive from one another and may be combined together. Unless otherwise indicated, the terms "substantially", "about" and "of the order of" mean to within 10% and preferably to within 5%. Moreover, the expressions "comprised between . . . and . . . " and equivalents mean that the limits are included, unless otherwise indicated.

The invention relates to an optoelectronic device for emitting or detecting light radiation, for example a laser diode, a light-emitting diode, or a photodetector, comprising a semiconductor layer formed from:

an elongate central segment, which is placed under tension along its longitudinal axis A1, and which comprises an active region suitable for emitting or detecting light radiation of interest;

tensioning arms, which place the central segment under tension along the longitudinal axis A1 of the latter; and electrical biasing arms, which are suitable for electrically biasing the active region along a transverse axis A2 of the central segment, each biasing arm being formed:

from a portion called the main portion, which makes electrical contact with a connection pad, the main portions of the biasing arms being doped opposite conductivity types, from a plurality of portions called joining portions, which link the main portion to the central segment.

Generally, the semiconductor layer is made of at least one crystalline semiconductor, which is preferably single-crystal. It may notably be chosen from the elements of column IV of the periodic table, such as germanium Ge, silicon Si and the semiconductor phase of tin Sn, and from compounds formed from these elements, for example GeSn, SiGeSn, and SiGe. It may also be chosen from III-V compounds comprising elements from columns III and V of the periodic table, such as for example GaInAs and InP, or even from II-VI compounds comprising elements of columns II and Vi, such as CdHgTe for example.

Preferably, the semiconductor layer is based on a semiconductor of interest the electronic band structure of which, if its crystal lattice is not sufficient tensilely strained, is indirect. The tensile deformation undergone by the semiconductor of the semiconductor layer in the central segment may then be sufficient for its band structure to become substantially direct. The semiconductor layer is here preferably based on germanium. By based on germanium or germanium-based, what is meant is that the semiconductor layer is formed mainly from germanium or from compounds thereof.

By strained segment, what is meant is a segment of the semiconductor layer that is subject to a tensile or compressive mechanical stress such as to lead to a deformation of the unit cells of its crystal lattice. The segment is tensilely strained when it is subjected to a mechanical stress that tends to stretch the unit cells of the lattice in a plane. In the context of the invention, the central segment of the semiconductor layer is tensilely strained in the plane of the layer, this meaning that its lattice parameter has a value, referred to as the effective value, higher than its natural value when the semiconductor is relaxed (i.e. unstrained). In the rest of the description, unless otherwise indicated, the strain in question is oriented in the plane of the semiconductor layer.

By direct or substantially direct electronic band structure, what is meant is that the energy minimum $E_{BC,L}$ of the conduction band of the L valley (or indirect valley) is above or substantially equal to the energy minimum $E_{BC,\Gamma}$ of the conduction band of the F valley (or direct valley); in other words: $\Delta E = E_{BC,L} - E_{BC,\Gamma} \geq 0$. By substantially equal, what is mean here is that this energy difference is of the order of magnitude or smaller than kT, where k is Boltzmann's constant and T is the temperature of the material. The semiconductor layer is preferably based on germanium the electronic band structure of which is indirect outside of the central segment (in other words $\Delta E < 0$) and the central segment of which has a sufficient tensile deformation to, preferably, make its electronic band structure direct at least locally.

Figure 2A:
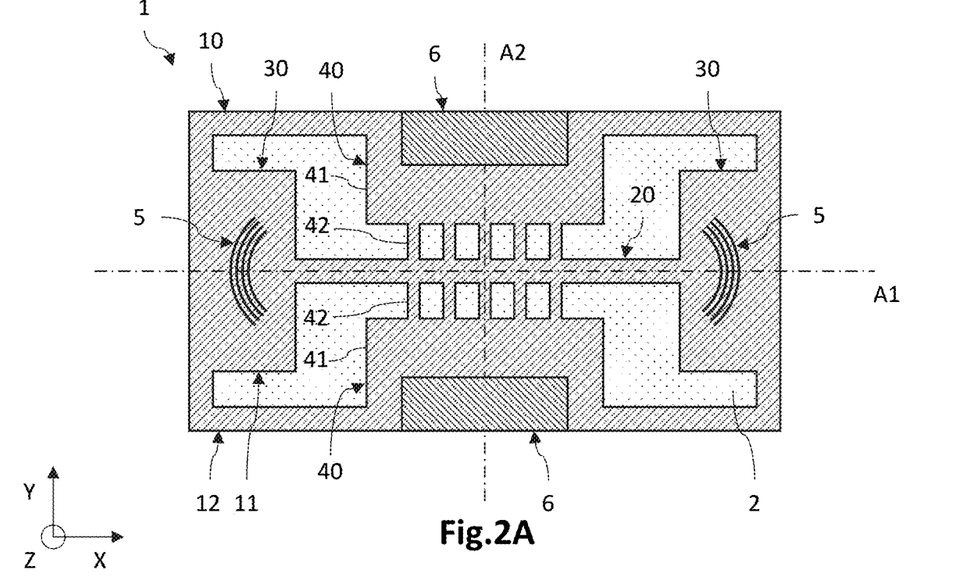
FIGS. 2A to 2C are schematic and partial views from above and in cross section along the longitudinal axis A1 and in cross section along the transverse axis A2, respectively, of an optoelectronic device for emitting coherent light according to one embodiment in which the central segment is suspended above a carrier layer.
Figure 2B:
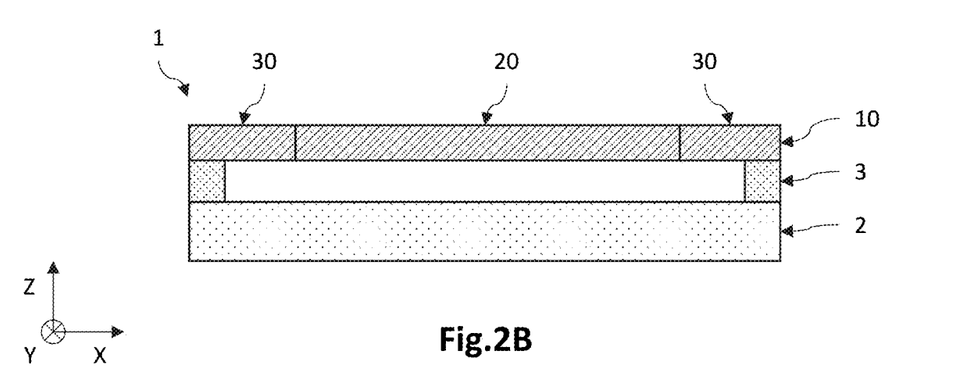
Figure 2C:
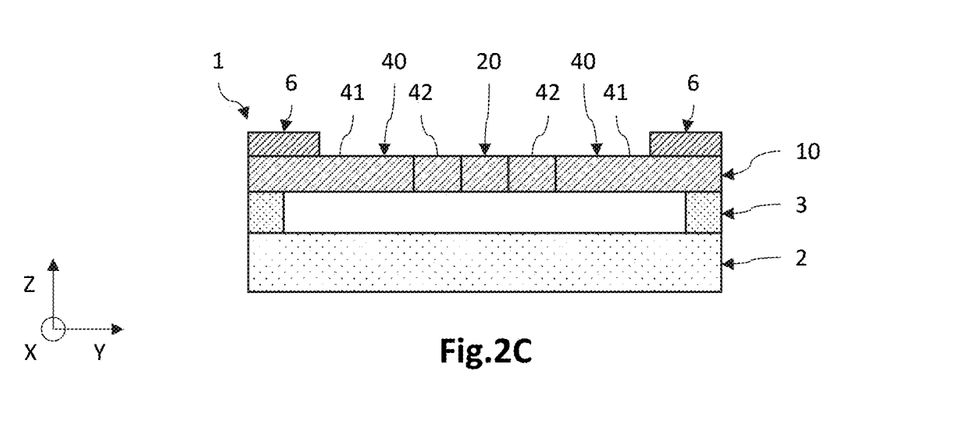

FIGS. 2A to 2C are partial and schematic views from above, in cross section along the axis A1, and in cross section along the axis A2, respectively, of an optoelectronic device 1 according to one embodiment. The optoelectronic device 1 is here suitable for emitting coherent light radiation (laser diode). As detailed below, it comprises an optical cavity oriented along a longitudinal axis A1, and the active region of the optoelectronic device 1 is electrically biased along a transverse axis A2. In this embodiment, the semiconductor layer 10, which is here based on germanium, comprises a structured portion 11 taking the form of a membrane that is suspended above a carrier layer 2 (although the membrane may, as a variant, make contact with the carrier layer 2).

Here a three-dimensional direct coordinate system XYZ that will be referred to in the rest of the description is defined, in which the XY plane is parallel to the plane of the semiconductor 10, in which the X-axis is oriented along the longitudinal axis of the central segment 20, and in which the Z-axis is oriented in the direction of the thickness of the semiconductor layer 10. Moreover, the terms "lower" and "upper" are to be understood to relate to positions that are nearer to and further from a carrier layer 2 in the Z-direction.

The optoelectronic device 1 here comprises a stack formed from a carrier layer 2, from a sacrificial layer 3, and from a semiconductor layer 10 based on a crystalline semiconductor, here based on germanium. The carrier layer 2 may be made of a material chosen from silicon, sapphire, borosilicate, silica, glass, and quartz or any other suitable material. It may have a thickness of a few tens of nanometers to a few hundred microns. The sacrificial layer 3 may be made of a material chosen from an oxide or nitride of silicon, inter alia. It may have a thickness of the order of a few tens of nanometers to a few microns. The semiconductor layer 10 may have a thickness of about a few tens of nanometers to a few microns, or even more, depending on the electronic or optoelectronic applications targeted. This stack may, at least partially, be obtained from a GeOI or SOI substrate. Moreover, the carrier layer 2 may comprise active or passive optical elements, notably in the context of the technology referred to as silicon photonics.

Generally, the semiconductor layer 10 may be formed from the same semiconductor, for example from Ge, or from the same chemical elements, for example from GeSn in which the atomic proportion of Sn may vary. As a variant, it may be formed by a stack of various sublayers based on the semiconductor of interest, which sublayers differ from one another in the chemical elements from which they are composed. Thus, by way of illustration, the semiconductor layer 10 may be formed from a stack of a sublayer made of intrinsic GeSn located between two sublayers made of Ge doped opposite conductivity types, and of lattice-matching sublayers made of SiGeSn each located between one sublayer made of doped Ge and the sublayer made of intrinsic GeSn. An example of such a stack of germanium-based sublayers is notably described in document WO2018037189.

In this embodiment, the semiconductor layer 10 is formed from a structured portion 11 that is suspended above the carrier layer 2 and from a peripheral portion 12 than encircles the structured portion 11. The peripheral portion 12 rests on the sacrificial layer 3, and the latter defines in the XY plane a cavity located under the structured portion 11. The structured portion 11 comprises a central segment 20 linked to the peripheral portion 12 by first lateral segments 30 forming tensioning arms, and by second lateral segments 40 forming electrical biasing arms.

The central segment 20 has a shape that is elongate in the XY plane, in the sense that it has a length along its longitudinal axis A1 that is larger than its width. The length and width of the central segment 20 are its dimensions in the XY plane. The shape of the central segment 20 in the XY plane may be rectangular, polygonal, oblong, inter alia. The length of the central segment 20 may be of the order of a few tens of microns, and its width may be of the order of a few microns. In the case where the local width of the central segment 20 varies along the longitudinal axis A1, the length is then larger than the average (for example arithmetic mean) width. The length of the central segment 20 is the longitudinal dimension of the segment 20 up to its junction with the arms 30 where the width increases.

The central segment 20 comprises a region referred to as the active region, which is intended to emit or detect light radiation of interest. In other words, the active region extends longitudinally within the central segment 20. It is formed from at least one intrinsic (unintentionally doped) semiconductor or may comprise one or more quantum wells. The active region here advantageously has a direct or substantially direct electronic band structure. Moreover, it is intended to be electrically biased along a transverse axis A2, which is orthogonal to the longitudinal axis A1.

The structured portion 11 of the semiconductor layer 10 comprises at least two first lateral segments, which form tensioning arms 30 that lie opposite each other with respect to the central segment 20 along the longitudinal axis A1.

These tensioning arms 30 are dimensioned so as to induce a tensile deformation in the central segment 20 along the longitudinal axis A1. They therefore extend longitudinally from the central segment 20, along the longitudinal axis A1, and more precisely from longitudinal ends of said segment. Thus, the longitudinal axis A1 corresponds to a main axis of deformation of the central segment 20. In this embodiment in which the structured portion 11 is a suspended membrane, the tensioning arms 30 participate in linking the central segment 20 to the peripheral portion 12.

As the central segment 20 is tensilely strained by the tensioning arms 30, its crystal structure is deformed by an increase in its natural lattice parameter along the longitudinal axis A1. The tensioning arms 30 allow the initial non-zero value of the tensile strain in the central segment 20 to be increased, preferably without however themselves experiencing a significant mechanical strain. To this end, as indicated above, the tensioning arms 30 are dimensioned so that the average width "b" of the tensioning arms 30 is larger than the average width "a" of the central segment 20, and preferably ten times larger. By width or local width, what is meant is the local dimension of a segment or of an arm, in the XY plane, along a transverse axis A2 orthogonal to the longitudinal axis A1. The average width of a segment may then be an average of its local width computed over the length of the segment.

Furthermore, the areal dimension in the XY plane and the width of each tensioning arm may be chosen so that the tensioning arms 30 exhibit no or substantially no deformation. More precisely, the local deformation in a tensioning arm decreases with distance from the central segment 20, and becomes negligible at a distance, along the longitudinal axis A1, larger than or equal to one or two times the length of the central segment 20. Thus, the average deformation of a tensioning arm, i.e. the deformation field integrated over the volume of the tensioning arm, has a negligible value with respect to the average deformation of the central segment 20.

The tensioning arms 30 may have in the XY plane a shape that is substantially rectangular, i.e. their width abruptly increases starting from the central segment 20, or even a trapezoidal shape, i.e. their width steadily increases with distance from the central segment 20. Of course, other shapes are possible.

The structuring of the suspended membrane (structured portion 11), and notably the dimensioning of the tensioning arms 30 with respect to the central segment 20, may be carried out so as to control the value of the amplification of the tensile strain of the central segment 20, which amplification is obtained during the production of the cavity and therefore the suspension of the membrane. To this end, the dimensional parameters of the structured portion 11, the widths and lengths of the central segment 20 and of the tensioning arms 30 for example, are determined beforehand. By way of example, in the case of a rectangular central segment 20, of length A and of constant width a, and of rectangular tensioning arms 30 of length B/2−A/2 and of constant width b, an amplification factor f relating the final tensile strain $\sigma^f$ of the central segment 20 to the initial tensile strain $\sigma^i$ may be expressed by the following relationship, which was derived in the article by Süess et al. entitled *Analysis of enhanced light emission from highly strained germanium microbridges*, Nature Photon. 7, 466-472 (2013):

$$f = \frac{2L+B}{B}\left(1 + \frac{A}{B-A}\right) / \left(\frac{a}{b} + \frac{A}{B-A}\right)$$

where L is the length of the suspended structured portion 11. Thus, depending on the dimensional parameters of the structured portion 11 of the semiconductor layer 10, it is possible to control the value of the amplification of the tensile strain applied to the central segment 20 during the production of the cavity. The amplification factor may also be estimated by means of a numerical simulation software package such as COMSOL Multiphysics.

The optoelectronic device 1 furthermore comprises second lateral segments, forming biasing arms 40, which are suitable for applying an electrical bias to the active region of the central segment 20 along the longitudinal axis A1, and preferably an electrical bias that is substantially uniform along the axis A1, while permitting the central segment 20 to be effectively placed under tension by the tensioning arms 30.

To this end, at least two biasing arms 40 are placed on either side of the central segment 20, opposite to one another along a transverse axis A2, this axis A2 being contained in the XY plane and being orthogonal to the longitudinal axis A1. They therefore extend from the lateral borders of the central segment 20 along the transverse axis A2. In this embodiment in which the structured portion 11 is a suspended membrane, the biasing arms 40 participate, with the tensioning arms 30, in linking the central segment 20 to the peripheral portion 12.

The biasing arms 40 are separate from the tensioning arms 30 in the XY plane. In other words, the biasing arms 40 are spaced apart by a non-zero distance from the tensioning arms 30 along the longitudinal axis A1.

Moreover, each of the biasing arms 40 comprises a main portion 41 and a plurality of joining portions 42, the latter providing the mechanical and electrical link between the main portion 41 and the central segment 20.

The main portion 41 thus has a width larger than the width of each joining portion 42. The width of the main portion 41 is here its dimension in the XY plane along the axis A1. Preferably, to ensure a substantially uniform electrical bias of the central segment 20 along the longitudinal axis A1, the main portion 41 of each biasing arm 40 has a width at least equal to the length of the active region of the central segment 20. In addition, the joining portions 42 are distributed along the axis A1 and hence the electric bias within the active region is substantially uniform along the axis of its length.

The main portion 41 of each biasing arm 40 allows the active region of the central segment 20 to be electrically biased from a connection pad 6. It therefore permits charge carriers to be moved between the central segment 20 and a connection pad 6. It therefore makes electrical contact with the connection pad 6. The latter may rest on and make contact, at least partially, with the main portion 41 of the biasing arm 40. The main portions 41 are made of a doped semiconductor, at least in a region linking the connection pad 6 and the joining portions 42, so as to facilitate the transport of the charge carriers. More precisely, the main portions 41 of the biasing arms 40 are doped opposite conductivity types: the main portion 41 of a first biasing arm 40 is doped $n^+$, and the main portion of the second biasing arm 40 is doped $p^+$.

For each biasing arm 40, a plurality of joining portions 42 provide the mechanical and electrical link between the corresponding main portion 41 and the central segment 20. The joining portions 42 therefore extend longitudinally, along the axis A2, from a lateral border of the central segment 20, and are separate from one another along the axis A1. By way of illustration, they may have a length of the order of the width of the central segment 20. They are spatially distributed along the longitudinal axis A1 and hence the electrical bias of the active region is substantially uniform. They may be doped the same conductivity type as the corresponding main portion 41, either over their entire length, or over a portion of their length starting from the main portion 41.

The optoelectronic device 1 also comprises at least two connection pads 6, which allow an electrical bias to be applied to the active region of the central segment 20, for example a forward bias in the case of a laser diode or a light-emitting diode, or a reverse bias in the case of a photodiode. To this end, each connection pad 6 makes electrical contact with a main portion 41 of a biasing arm 40, and may rest, at least partially, on and in contact with the main portion 41.

Preferably, to improve the quality of the electrical bias of the active region, the connection pads 6 are each partially encircled by an electrical isolation line (not shown). An isolation line extends around a connection pad 6 between the connection pad and the peripheral portion 12, but does not extend between the connection pad and the biasing arm 40. The isolation lines may be through-trenches, i.e. trenches that pass right through the semiconductor layer 10.

In operation, the application to the connection pads 6 of a forward-biasing potential difference (for a laser diode or a light-emitting diode) results in an injection of charge carriers into the active region of the central segment 20, via the main portions 41 and the joining portions 42. The electrical bias of the active region is substantially uniform along the longitudinal axis A1, while the central segment 20 remains effectively tensilely strained by the tensioning arms 30. In the case of a photodiode, the application of a reverse-biasing potential difference allows the charge carriers photogenerated in the active region of the central segment 20 to be collected.

Thus, the optoelectronic device 1 comprises an active region located in an elongate central segment 20 that is placed under tension along the longitudinal axis A1 by the tensioning arms 30. The electronic band structure of the semiconductor of the central segment 20 and therefore of the active region is then advantageously made direct by the tension generated by the tensioning arms 30. The biasing arms 40, which are separate from the tensioning arms 30 and oriented along the transverse axis A2, because they are each formed from a main portion 41 and joining portions 42, allow an electrical bias to be applied to the active region of the central segment 20 substantially uniformly along the longitudinal axis A1, while permitting the central segment 20 to be effectively placed under tension by the tensioning arms 30. In other words, the uniaxial tensioning of the central segment 20 is here ensured by the tensioning arms 30 and not by the biasing arms 40. In the example of FIG. 2A, a tensile strain $\varepsilon_{xx}$ of the order of 1.5% may be obtained, with a transverse tensile strain $\varepsilon_{xx}$ of almost zero. Moreover, the substantially uniform electrical bias of the active region may be obtained with the plurality of joining portions 42. The diffusion length of the charge carriers (electrons and holes) may be taken into account to optimize the dimensions. Thus, the average width of the central segment 20 along the Y-axis may be at least of the same order of magnitude as the diffusion length of the carriers. Radiative recombination mainly occurs in the center of the central segment 20, allowing a good overlap with the guided optical mode. Moreover, the distance between the joining portions 42 along the axis A1 may be smaller than or equal to the diffusion length of the carriers, so as to obtain a uniform microscopic bias (in the joining portions 42) and a uniform macroscopic bias (along the central segment 20). In the case where the distance between the joining portions 42 along the axis A1 is larger than the diffusion length of the carriers, only a uniform macroscopic bias (along the central segment 20) will be obtained. Irrespectively, the diffusion length of the carriers may be large in germanium (at least equal to 1 mm). It of course depends notably on the temperature, on the tensile strain, and on the crystal quality.

In addition, it would appear that the impact of the type of process used to fabricate the optoelectronic device 1 on the optical and/or electronic properties of the latter is decreased with respect to the example of the optoelectronic device 1 illustrated in FIG. 1, in which the active region is electrically biased via tensioning arms 30.

Specifically, it would appear that, when the semiconductor layer 10 is produced by epitaxy (e.g. Ge epitaxially grown on Si, or GeSn epitaxially grown on Ge), a high dislocation density may induce residual doping within the semiconductor layer 10, of p-type for example. The injection or collection of charge carriers into or from the central segment 20 is then no longer uniform along the axis A1 but becomes non-uniform: thus, the charge carriers are then essentially injected into a region located at the junction between the p-doped central segment 20 and n-doped tensioning arm. In other words, the size and more precisely the length of the active region is then decreased. This may then result in a degradation in the optical and/or electronic properties of the optoelectronic device 1: thus, in the case of a laser diode, the effectiveness of the electrical pumping may be degraded, and in the case of a light-emitting diode and of a photodiode, the optically emissive/receptive area may be greatly decreased.

In contrast, in the case of the optoelectronic device 1 according to the invention, the active region is electrically biased via the biasing arms 40 along the transverse axis A2, and not via the tensioning arms 30 along the longitudinal axis A1. Thus, whether the central segment 20 has a residual doping or not, the electrical bias remains substantially uniform along the longitudinal axis A1. Thus, the optical and/or electrical properties of the optoelectronic device 1 according to the invention are less impacted by the type of fabrication process employed, and in addition they are optimized. Specifically, the internal quantum efficiency is high over a large portion of the length of the central segment 20, this allowing the emitted optical power or the area of light detection to be maximized (equivalently, wall-plug efficiency is maximized). In other words, for a given potential difference applied to the active region of the central segment 20, the emitted optical power or the area of light detection is optimized. In addition, in the case of a laser source, the fact of dissociating the optical axis of the laser cavity (axis A1) from the axis of electrical bias (axis A2) allows intra-cavity optical losses to be decreased. Specifically, the tensioning arms 30, which may comprise optical reflectors 5, are advantageously made of an intrinsic (unintentionally doped) semiconductor and not of a (highly) doped material, thus decreasing optical losses.

In this respect, the optoelectronic device 1 illustrated in FIGS. 2A to 2C is suitable for emitting coherent light radiation. The laser cavity of this laser diode is oriented along the longitudinal axis A1 of the elongate central segment 20. To this end, optical reflectors 5, Bragg mirrors for example, are placed in the tensioning arms 30 on either side of the central segment 20. The active region forms the gain medium of the laser diode, which is located in the central segment 20. The later may be based on intrinsic germanium, and for example made of GeSn. The gain medium is electrically pumped via the biasing arms 40 as described above, which arms are doped $n^+$ and $p^+$. Thus, by applying a potential difference to the active region via the connection pads 6 and via the biasing arms 40, the gain medium is electrically pumped, which results in the coherent emission of light radiation. In this example, the optical reflectors 5 are Bragg mirrors, but it may also be a question of corner-cube retroreflectors as notably described in the article by Zabel et at entitled *Top-down method to introduce ultra-high elastic* strain, J. Mater. Res., 2017, 32 (4), 726-

736. Moreover, the material of the tensioning arms 30 is advantageously intrinsic, so as to limit optical losses in the optical cavity.

Figure 3A:
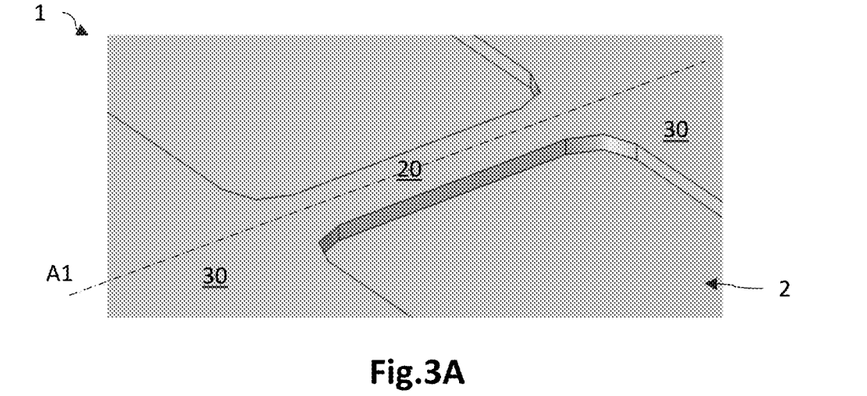
FIGS. 3A and 3B are schematic and partial views, in perspective, of an optoelectronic device according to one example of the prior art (FIG. 3A) and of an optoelectronic device according to one embodiment (FIG. 3B)
Figure 3B:
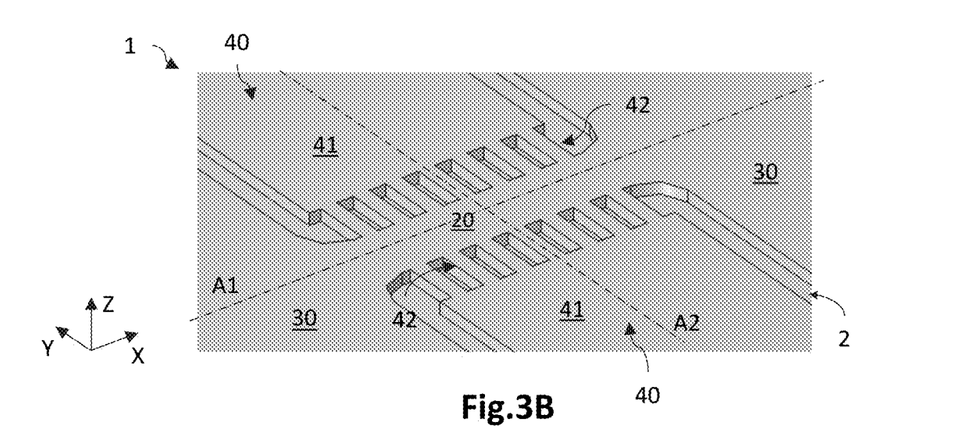
Figure 3C:
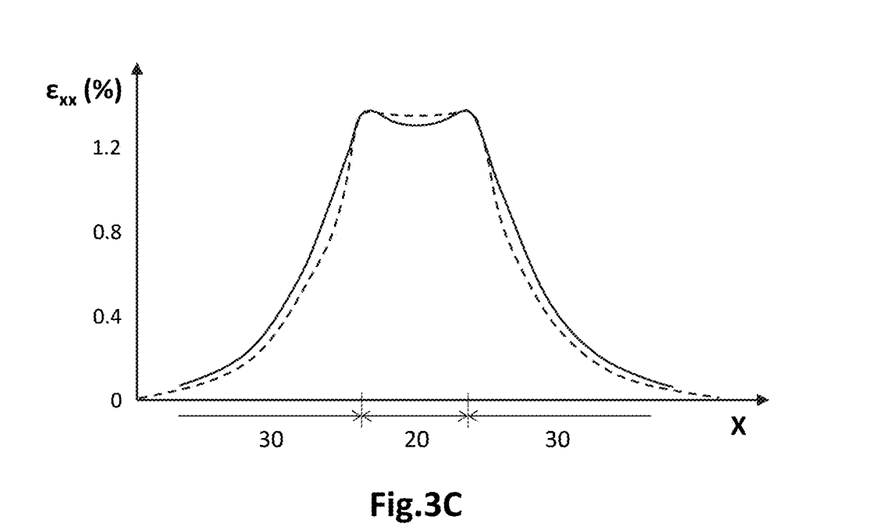
FIG. 3C illustrates the variation in the mechanical strain c oriented along the longitudinal axis A1 experienced by the central segment and by the tensioning arms for the two optoelectronic devices illustrated in FIGS. 3A and 3B.

FIGS. 3A and 3B are schematic and partial views in perspective of an optoelectronic device 1 according to an example of the prior art (and therefore comprising no biasing arms 40), and of an optoelectronic device 1 according to one embodiment (and therefore comprising biasing arms 40), respectively. In addition, FIG. 3C illustrates the variation in the mechanical strain $\varepsilon_{xx}$ along the longitudinal axis A1 passing through the center of the central segment 20 along the Y-axis, for these two configurations. Moreover, the structured portion 11 of these optoelectronic devices is a membrane that is suspended above a carrier layer 2.

With reference to FIG. 3A, the optoelectronic device 1 according to the prior art comprises an active region in the central segment 20, which is electrically biased via the tensioning arms 30. The latter are doped opposite conductivity types so as to ensure the electrical connection with connection pads (which are not shown). Thus, the tensioning arms 30 perform the mechanical function of placing the central segment 20 under tension, and the electrical function of biasing the active region. In this example, the semiconductor layer 10 is made of the same semiconductor, here germanium. The central segment 20 has a length along the X-axis equal to about 10 µm and a width along the Y-axis equal to about 1.5 µm. The length may be larger, for example about 20 µm, notably when the dislocation density is low. Moreover, the width may be about 1 to 2 µm in order to obtain a good overlap of the optical modes while permitting a substantial tensile deformation. The tensioning arms 30 here have a rectangular shape in the XY plane, with a length of about 800 µm so as to obtain a tension of about 5.5% in the case of Ge (in the case of GeSn, a length of 60 µm allows a tension of about 1.4% to be obtained) and a width equal to about 50 µm.

With reference to FIG. 3B, the optoelectronic device 1 according to this embodiment comprises biasing arms 40 that are separate from the tensioning arms 30 and that electrically bias the active region of the central segment 20. They are linked to the lateral borders of the central segment 20, and are each formed from a main portion 41 and from a plurality of joining portions 42. Connection pads (not shown) therefore make electrical contact with the main portions 41. The semiconductor in the tensioning arms 30 may then be intrinsic. In this example, the semiconductor layer 10 is also made of germanium; the central segment 20 has dimensions identical to those of the device of FIG. 3A, and the dimensions of the tensioning arms 30 are, for their part, substantially identical: the length is here 9% larger than that of the tensioning arms 30 of FIG. 3A. The biasing arms 40 each comprise a main portion 41 of rectangular shape of length along the Y-axis equal to about 30 µm and of width along the X-axis equal to about 8 µm, and joining portions 42 of rectangular shape of length equal to about 1.5 µm and of width equal to about 500 nm. In this example, each biasing arm 40 comprises seven joining portions 42 that are spaced apart pairwise by a distance along the X-axis equal to about 1 µm. Moreover, each biasing arm 40 is spaced apart from the tensioning arms 30 by a distance along the X-axis equal to about 2 µm.

As illustrated in FIG. 3C, in the case of the optoelectronic device 1 of FIG. 3A (without biasing arms 40), the tensile strain $\varepsilon_{xx}$ in the central segment 20 (dashed line) has a maximum value of the order of about 1.4% and an average value of the order of about 1.35%. Moreover, in the case of the optoelectronic device 1 of FIG. 3B (with biasing arms 40), the tensile strain $\varepsilon_{xx}$ (continuous line) has a maximum value also of the order of about 1.4% and an average value of the order of about 1.3%. Thus, it would appear that, in the optoelectronic device 1 according to the present embodiment, the central segment 20 is effectively placed under tension by the tensioning arms 30. The biasing arms 40, because of their structure formed from the main portion 41 and the joining portions 42, allows the active region to be electrically biased, without substantially impacting the tensile strain $\varepsilon_{xx}$ experienced by the central segment 20. In addition, the arrangement of the joining portions 42 along the lateral borders of the central segment 20 allows the active region to be biased substantially uniformly along the longitudinal axis A1. The optical and/or electronic properties of the optoelectronic device 1 according to the embodiment of FIG. 4B are therefore improved with respect to the optoelectronic device 1 of FIG. 4A.

Figure 4A:
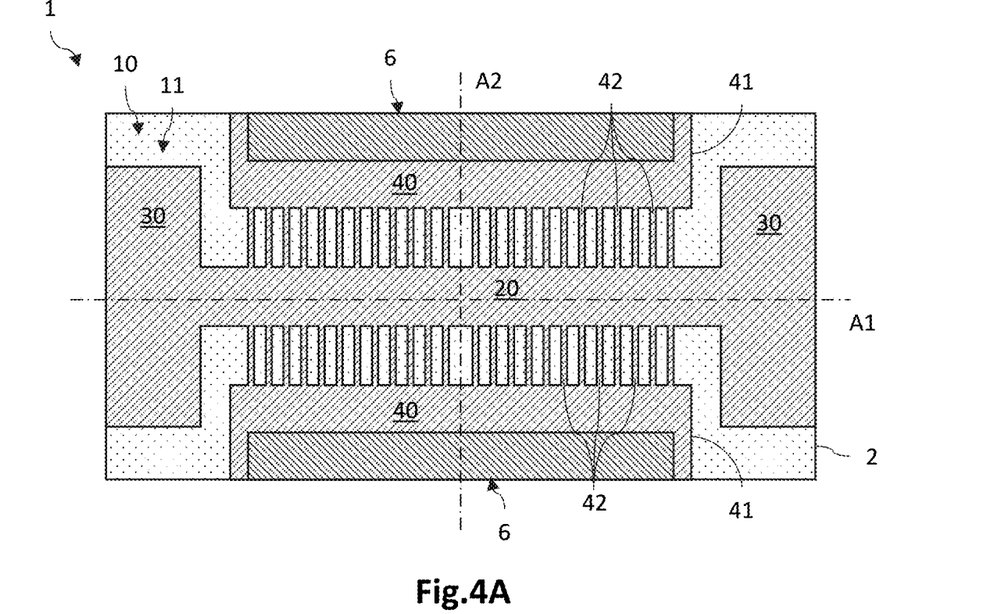
FIGS. 4A and 4B are schematic and partial views from above of optoelectronic devices for emitting coherent light according to various embodiments in which the optical cavity is defined by the joining portions of the biasing arms.
Figure 4B:
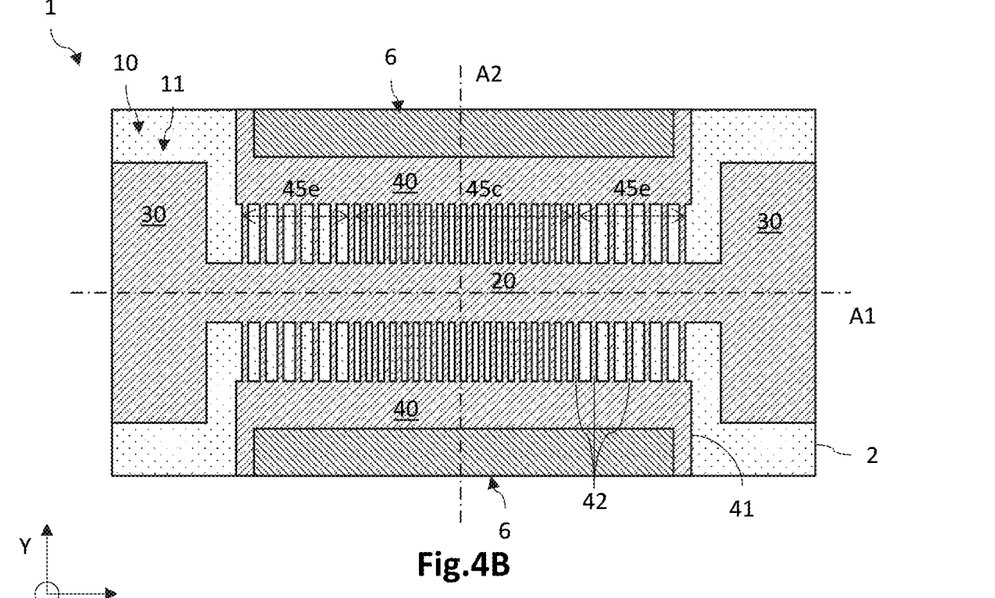

FIGS. 4A and 4B are schematic and partial views from above of optoelectronic devices according to embodiments in which they are suitable for emitting coherent light radiation. They differ from the optoelectronic device 1 illustrated in FIG. 2A essentially in that the joining portions 42 perform, apart from their mechanical and electrical linking function, the (additional) function of optical reflectors 5 allowing the optical cavity of the laser diode to be defined. In these examples, the structured portion 11 of the semiconductor layer 10 forms a membrane that is suspended above a carrier layer 2, but may as a variant make contact with the latter.

To this end, the joining portions 42 have an arrangement along the longitudinal axis A1 and dimensions such that they form optical reflectors 5 with respect to the optical mode supported by the central segment 20. Various types of optical cavities are possible, for example DFB (for distributed feedback laser) cavities or DBR (for distributed Bragg reflector) cavities, or even band-edge cavities. Generally, the joining portions 42 of the biasing arms 40 are dimensioned and arranged symmetrically on either side of the central segment 20. The dimensions of the joining portions 42 may be chosen using band diagrams of one-dimensional photonic crystals, which express the dispersion relationship of the optical mode supported by the central segment 20, and notably depend on the characteristics of the periodic structure that the joining portions 42 form, namely their fill factor (ratio of the width of a joint to the period of the periodic structure) and the period of the periodic structure divided by the wavelength of the confined optical mode.

In the example of FIG. 4A, the joining portions 42 of the biasing arms 40 define a DFB optical cavity. The joining portions 42 thus extend along the longitudinal axis periodically, to thus form a distributed reflector along the entire length of the active region. A period non-uniformity is present at the center of the periodic structure, so as to induce a phase shift and therefore form a λ/4 cavity, where λ is the emission wavelength of the laser source. By way of example, for a central segment 20 of a length of about 20 µm and of a width of about 2 µm, a periodic structure formed by the joining portions 42, and having a fill factor of 50% for an adimensional period p/λ equal, for example, to 0.16 or to 0.3 for a quasi-TE polarization of the propagation modes, allows a DFB optical cavity to be obtained.

In the example of FIG. 4B, the joining portions 42 of the biasing arms 40 define a DBR optical cavity. The joining portions 42 thus extend along the longitudinal axis, which is dimensioned to define three separate regions: in end regions 45e, the joining portions 42 are dimensioned so as to form Bragg-mirror optical reflectors 5; and in a central region 45c, the joining portions 42 are dimensioned so as to minimize any influence on the confined optical mode. As above, the joining portions 42 in the various regions 45c, 45e are dimensioned using band diagrams. By way of example, for a central segment 20 of a length of about 20 µm and of a width of about 2 µm, and for a fill factor of 20%, an adimensional period p/λ equal to about 0.4 or also to 0.6 for quasi-TE propagation modes allows Bragg mirrors to be obtained in the end regions 45e, and an adimensional period p/λ equal to 0.15 in the central region 45c allows any optical disruption by the joining optical portions 42 located in this region 45c on the confined optical mode to be limited.

Moreover, other types of optical cavities may be formed depending on the dimensions of the joining portions 42 and on their arrangement along the longitudinal axis A1. By way of example, a band-edge optical cavity may be formed, in which the joining portions 42 have dimensions and an arrangement along the axis A1 such that the group velocity of the optical mode is zero in end regions similar to those of FIG. 4B. An example of this type of optical cavity is notably described in the document Reboud et al, Applied Physics Letters, *Lasing in nanoimprinted two-dimensional photonic crystal band-edge lasers*, 102, 7, 073101 (2013).

Thus, in an optoelectronic device 1 according to this embodiment in which the optical cavity is formed by the joining portions 42, the tensioning arms 30 advantageously do not comprise optical reflectors 5 such as Bragg mirrors or corner-cube retroreflectors. Thus, a potential degradation of the strain in the central segment 20 by the tensioning arms 30 is avoided, this degradation possibly originating from the presence of the optical reflectors 5 in the tensioning arms 30. The fabrication process is then simplified in so far as it does not comprise specific steps of producing optical reflectors 5 in the tensioning arms 30. In addition, optical losses, related to potential optical scattering during the transfer of the optical mode between the central segment 20 and the tensioning arms 30, are decreased or even avoided.

Figure 5A:
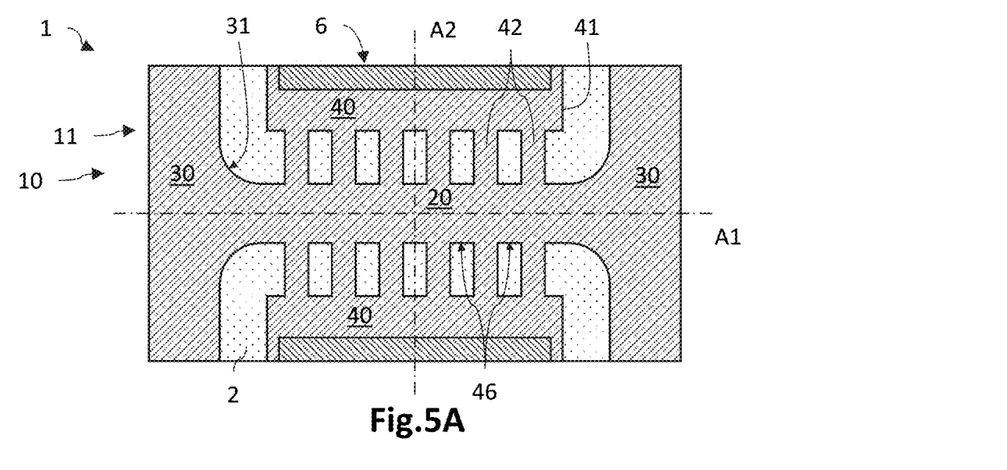
FIGS. 5A and 5B are schematic and partial views in perspective of an optoelectronic device according to one embodiment in which the junction between the joining portions and the central segment is substantially orthogonal (FIG. 5A), and of an optoelectronic device according to another embodiment in which the junction between these elements is curved (FIG. 5B)
Figure 5B:
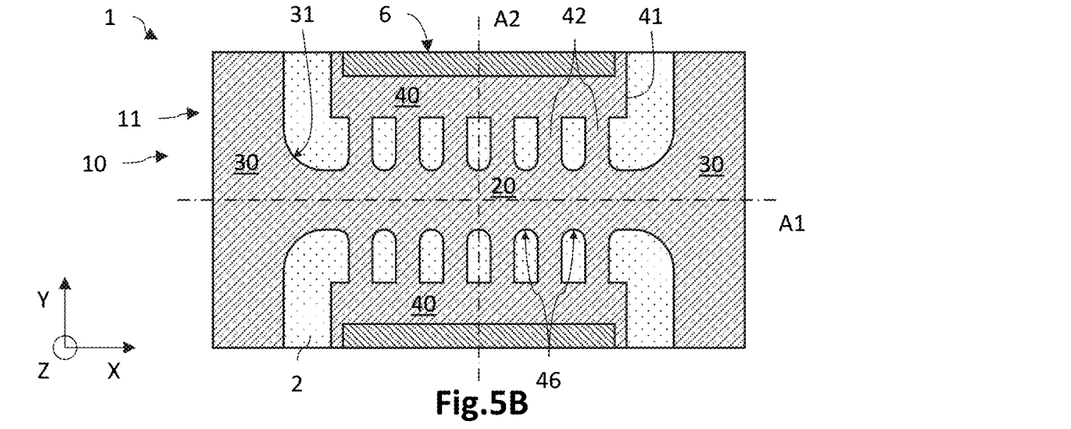

FIGS. 5A and 5B are schematic and partial views from above of optoelectronic devices according to embodiments that differ from each other essentially in the shape of the junctions, which are curved or uncurved, between the joining portions 42 and the central segment 20. In these examples, the structured portion 11 of the semiconductor layer 10 forms a membrane that is suspended above a carrier layer 2, but may as a variant make contact with the latter.

In the example of FIG. 5A, the optoelectronic device 1 is similar to that illustrated in FIG. 3B. The semiconductor layer 10 is made from the same semiconductor, here germanium-tin GeSn, and has a thickness of about 1 µm. The central segment 20 has a rectangular shape, of length equal to about 20 µm and of width equal to about 2 µm. The tensioning arms 30 are of rectangular shape, of length equal to about 50 µm and of width equal to about 20 µm. Each biasing arm 40 has a main portion 41 of rectangular shape of length equal to 30 µm and of width equal to 8 µm, and joining portions 42 of rectangular shape of length equal to 1.5 µm and of width equal to 650 nm. In this example, each biasing arm 40 comprises six joining portions 42 that are spaced apart pairwise by a distance, along the X-axis, equal to about 650 nm. Moreover, each biasing arm 40 is spaced apart from the tensioning arms 30 by a distance along the X-axis equal to about 2 µm. In this example, the junction 46 between each joining portion 42 and the central segment 20 is uncurved, but is substantially orthogonal, to within technological tolerances. It will be noted, in this respect, that the geometries shown here are schematic: in fact, the "orthogonal" junctions 46 will be slightly rounded, but they remain "uncurved", according to the definition given below.

In the example of FIG. 5B, the optoelectronic device 1 is similar to that illustrated in FIG. 5A, and differs therefrom essentially in the shape of the junction 46 between the joining portions 42 and the central segment 20. The junctions 46 are here curved, in the sense that they have a curvature the radius of which is equal to half the distance that separates two adjacent joining portions 42 along the X-axis, to within 25%. The joints advantageously have curved junctions also with the main portion 41 of the biasing arms 40. Thus, the apertures that separate two adjacent joining portions 42 here have a rectangular shape with circularly arcuate rounded ends.

Figure 5C:
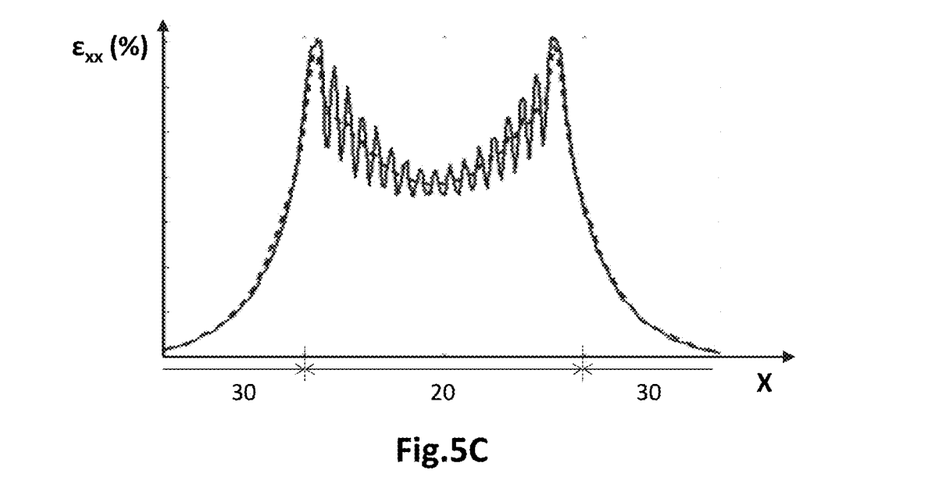
FIG. 5C illustrates the variation in the mechanical strain $\varepsilon_{xx}$ oriented along the longitudinal axis A1 experienced by the central segment and by the tensioning arms for the two optoelectronic devices illustrated in FIGS. 5A and 5B.

FIG. 5C illustrates the variation in the mechanical strain $\varepsilon_{xx}$ along the longitudinal axis A1, which passes along the Y-axis at a distance of 100 nm from a lateral border of the central segment 20, in the case of the above two examples. It may be seen therefrom that, for the configuration with orthogonal junctions (FIG. 5A), the tensile strain $\varepsilon_{xx}$ presents large longitudinal oscillations (see the continuous line in FIG. 5C), the amplitude of which varies between about 0.25% and 1.2%. In contrast, for the configuration with curved junctions (FIG. 5B), the tensile strain $\varepsilon_{xx}$ presents longitudinal oscillations the amplitude, here lower, of which varies between about 0.05% and 0.2% (see the dashed line in FIG. 5C). Thus, the presence of curved junctions between the joining portions 42 and the central segment 20 allows the longitudinal distribution of the mechanical strains to be improved, this resulting in a central segment 20 of better mechanical stability, and in optical and/or electronic properties within the central segment 20 and therefore within the active region of better uniformity.

Moreover, as illustrated in FIGS. 5A and 5B, the central segment 20 advantageously has a junction 31 with the tensioning arms 30 that has a circularly arcuate curvature. The radius of curvature is at least equal to half the local width of the central segment 20 at its longitudinal ends (in proximity to the tensioning arms 30), and preferably at least equal to the local width of the central segment 20. Thus, by way of illustration, for a central segment 20 of a local width of 2 µm at its longitudinal ends, the radius of curvature is at least equal to 1 µm and preferably at least equal to 2 µm. Specifically, an orthogonal junction 31 between the central segment 20 and the tensioning arms 30, i.e. one that is right-angled to within technological tolerances, may result in the presence of a peak in tensile strain $\varepsilon_{xx}$ at the longitudinal ends of the central segment 20. These peaks in strain may result in the formation of a potential barrier that induces local trapping of charge carriers. Thus, the circularly arcuate curved junctions 31 allow the uniformity of the spatial distribution of the tensile strain to be improved, and thus the risk of forming regions of concentration of mechanical strain to be decreased or even avoided. Thus, the risk of local trapping of charge carriers is decreased and the uniformity of the optical and/or electrical properties of the central segment 20 and therefore of the active region is improved.

Figure 6A:
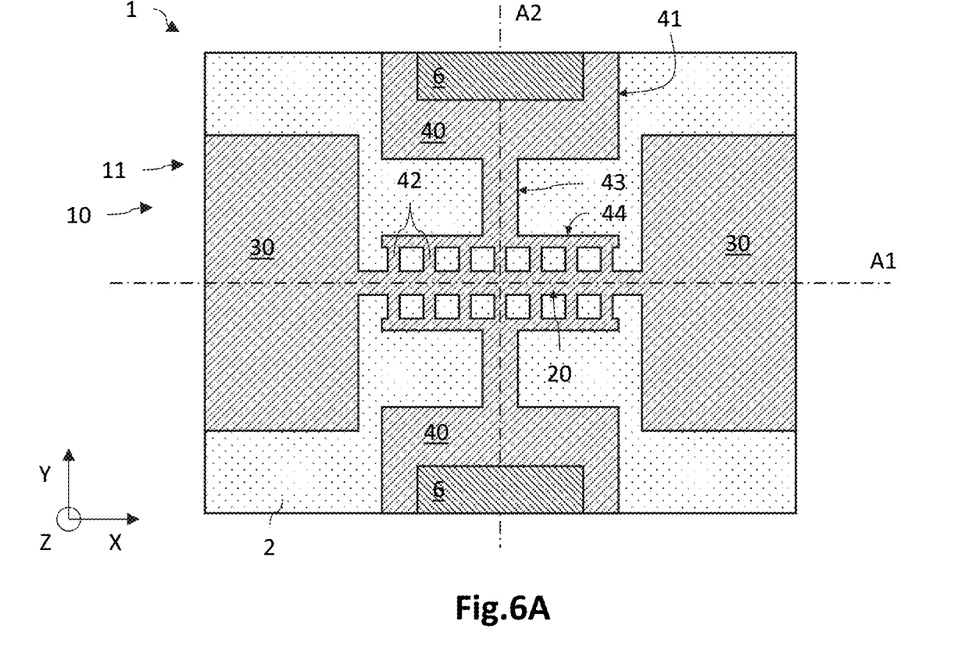
FIGS. 6A and 6B are schematic and partial views from above and in perspective, respectively, of optoelectronic devices according to various embodiments, in which the biasing arms are suitable for inducing a tension in the central segment along the transverse axis A2.
Figure 6B:
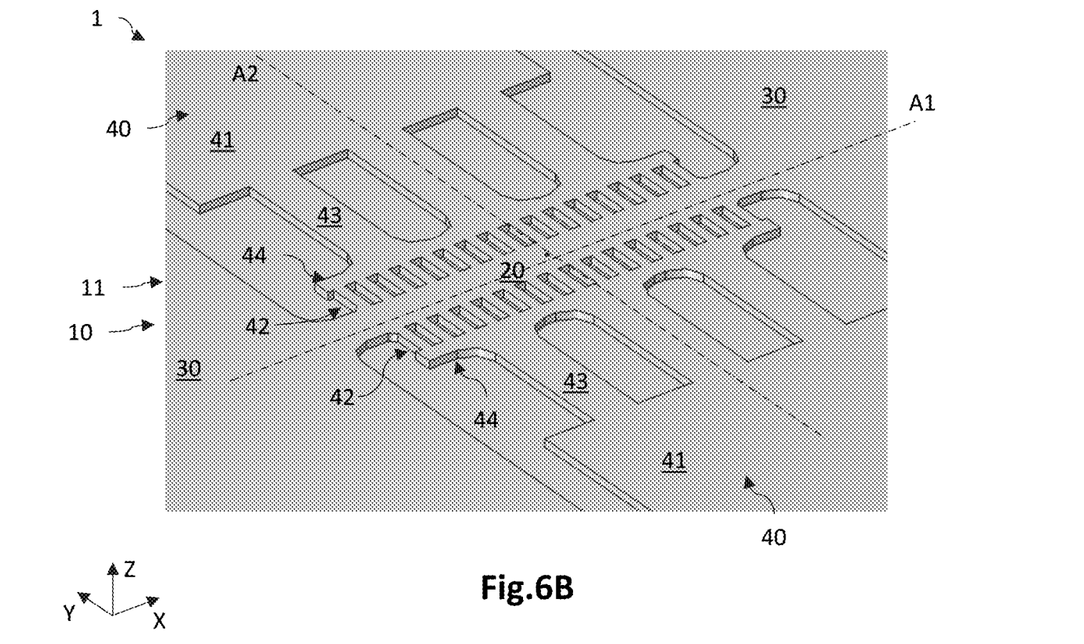

FIGS. 6A and 6B are schematic and partial views of optoelectronic devices according to embodiments, seen from above and in perspective, respectively. In these examples, the biasing arms 40 are furthermore suitable for inducing, in the central segment 20, a tensile strain along the transverse axis A2. The central segment 20 is then tensilely strained biaxially, i.e. along the longitudinal axis A1 and along the transverse axis A2. Moreover, the structured portion 11 of the semiconductor layer 10 is here a membrane that is suspended above the carrier layer 2, but may as a variant make direct contact with the latter.

To be able to tensilely strain the central segment 20 along the transverse axis A2, the biasing arms 40 each comprise at least one intermediate portion 43 linking the main portion 41 and the plurality of joining portions 42. A continuous portion 44 then ensures the mechanical (and electrical) link between the one or more intermediate portions 43 and the joining portions 42. A tensile strain $\varepsilon_{xx}$ of 1.5% along the axis A1 may be obtained, with a tensile strain $\varepsilon_{yy}$ of 1.5% along the axis A2.

More precisely, each biasing arm 40 comprises a continuous portion 44 that extends longitudinally along the longitudinal axis A1, and connects the ends of the joining portions 42 that are opposite to the central segment 20. The continuous portion 44 may have a length along the longitudinal axis A1 that may be equal to the width of the corresponding main portion 41, and a width along the transverse axis A2 smaller than or equal to the length of the joining portions 42, so as to improve electrical conduction. The continuous portion 44 is preferably doped the same conductivity type as the corresponding main portion 41.

Moreover, the one or more intermediate portions 43 of each biasing arm 40 extend longitudinally along the transverse axis A2, and link the continuous portion 44 to the main portion 41. To ensure the central segment 20 is placed under tension with respect to the transverse axis A2, the intermediate portions 43 have lengthwise and widthwise dimensions that mainly depend on those of the main portions 41 (ratio between the dimensions of the portions 43 and those of the portions 41). Thus, they each have a length and a width that are smaller than those of the main portions 41. These values may be estimated by means of a numerical simulation software package such as COMSOL Multiphysics, depending on the desired value of the strain amplification factor along the axis A2 within the central segment 20. Thus, during the suspension of the structured portion 11, the initial value of the tensile strain $(\sigma^i)_{A2}$ along the axis A2 experienced by the central segment 20 is increased by the biasing arms 40. The amplification factor relating the final tensile strain $(\sigma^f)_{A2}$ to the initial tensile strain $(\sigma^i)_{A2}$ may be expressed by a relationship similar to that of the article by Süess et al. 2013 cited above.

The biasing arms 40 preferably comprise the same number of intermediate portions 43, which are then distributed and dimensioned symmetrically with respect to the longitudinal axis A1, in order to ensure a better mechanical stability of the central segment 20, and a better uniformity of the tensile strain along the transverse axis A2 within the central segment 20.

By way of illustration, FIG. 6A illustrates an example of an optoelectronic device 1 in which each biasing arm 40 comprises a single inter mediate portion 43. The arms are then arranged along the transverse axis A2 that passes through the center of the central segment 20. In the example of FIG. 6B, each biasing arm 40 comprises three intermediate portions 43 of identical dimensions and arranged along the axis A1, so as to improve the uniformity of the tensile strain experienced by the central segment 20.

So as to improve the injection or collection of charge carriers, the one or more intermediate portions 43 and the continuous portions 44 are made of a doped semiconductor. The doping level is chosen so as to decrease electrical resistance and thus to facilitate the transport of charge carriers. The joining portions 42 may also be doped, with a similar doping level, at least from the corresponding continuous portion 44.

Thus, the central segment 20 here experiences a biaxial tensile strain along the longitudinal axis A1 (via the tensioning arms 30) and along the transverse axis A2 (via the biasing arms 40). The biasing arms 40 therefore perform the electrical function of biasing the active region within the central segment 20, and the mechanical function of placing the central segment 20 under tension along the transverse axis A2. The tensile strain experienced by the central segment 20, which is required to obtain a direct electronic band structure, may then have a value lower that the one required in the case of the uniaxial tensile strain. It will be noted that the optoelectronic device 1 according to this embodiment has a different configuration from that notably described in document EP2960203, in which the central segment 20 has a length/width aspect ratio substantially equal to one. Specifically, here, the central segment 20 is elongate, this allowing improved optical and/or electronic properties, and notably a higher optical power, to be obtained.

As mentioned above, the structured portion 11 of the semiconductor layer 10 may be a membrane that is suspended above a carrier layer 2, or may make contact with the carrier layer 2. The optoelectronic device 1 may be obtained using a fabrication process similar to that described in European patent EP3151265.

The semiconductor layer 10 is locally doped, and more precisely the biasing arms 40 and in particular the main portions 41 and optionally the joining portions 42 are locally doped, for example after growth, by implanting doping elements, this being followed by an anneal so as to activate the dopants. The semiconductor layer 10 advantageously remains intrinsic in the tensioning arms 30.

Next, after or simultaneously to the formation of the suspended membrane, the structured portion 11 may be brought into contact with the carrier layer 2. The structured portion 11 may be secured to the carrier layer 2 by hydrophilic or hydrophobic direct bonding. Thus, after suspension of the structured portion 11 above the carrier layer 2, contact may be achieved by submerging the structured portion 11 in a liquid solution and then evaporating the liquid, so that the structured portion 11 is then naturally brought into contact with the carrier layer 2. The direct bonding is hydrophobic when the surfaces are secured to each other by way of hydrogen bonds. This is notably the case when the semiconductor layer 10 is based on germanium and the carrier layer 2 is made of silicon. As a variant, the structured portion 11 may be brought into contact with the carrier layer 2 during the formation of the cavity, by wet etching in high-pressure HF vapor or in liquid HF. It will be noted that it is advantageous for the top face of the carrier layer 2 to be formed from a sublayer made of a dielectric, SiN or $HfO_2$ for example, that is inert with respect to the etchant (HF) used to bring the central segment 20 into contact with the carrier layer 2.

The structured portion 11 may then be separated from the peripheral portion 12. Preferably, to improve the mechanical resistance of the structured portion 11, and more precisely to increase the bonding energy associated with the surfaces in contact with respect to the elastic energy associated with the tensioning arms 30 and with the biasing arms 40, a consolidation anneal is advantageously carried out. Next, a distal segment of the tensioning arms 30 and of the biasing arms 40 may be removed by local etching. The distal segment is a segment of the arms that is far from the central segment 20 and that ensures the mechanical junction with the peripheral portion 12. It will be noted that the peripheral portion 12 may also be entirely removed.

As a variant, the structured portion 11 may be secured to the carrier layer 2 by hydrophilic direct bonding. In this case, a thin layer of an intermediate material, obtained by deposition or by oxidation, may then be present between the carrier layer 2 and the semiconductor layer 10. The intermediate material may be an oxide or a nitride. This thin intermediate layer may participate in ensuring the electrical insulation between the structured portion 11 and the carrier layer 2. Moreover, hydrophilic direct bonding has the advantage of having a bonding energy higher than that of hydrophobic bonding up to annealing temperatures of the order of 500° C. to 600° C. (in the case of GeSn, the annealing temperature may preferably be at most 300° C.).

Figure 7A:
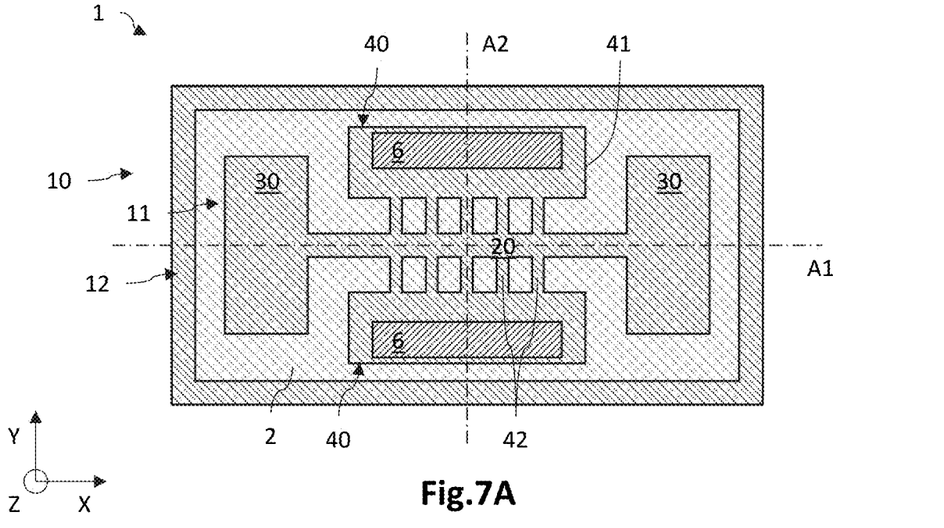
FIGS. 7A to 7C are schematic and partial views of optoelectronic devices according to various embodiments.
Figure 7B:
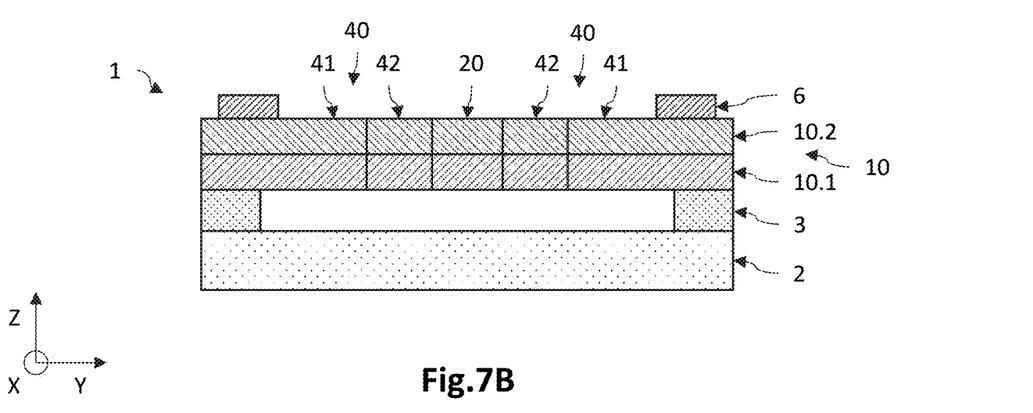
Figure 7C:
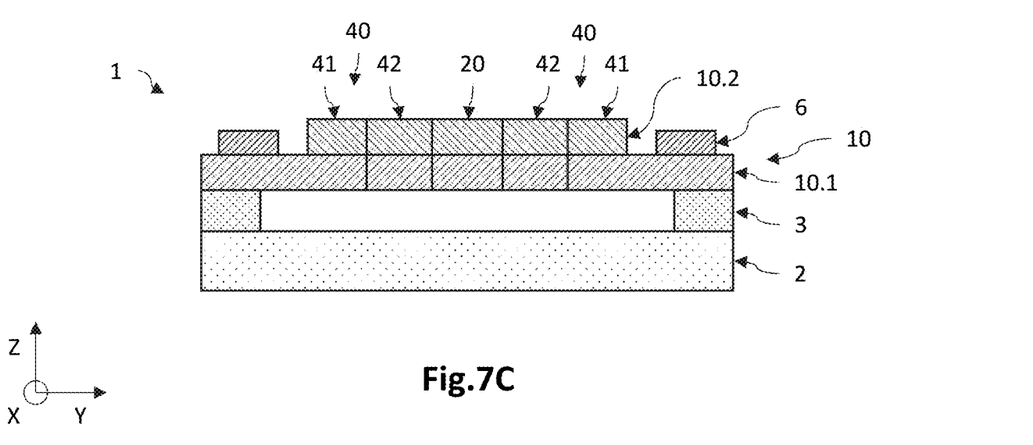

FIGS. 7A to 7C illustrate various optoelectronic devices according to variant embodiments.

FIG. 7A is a schematic and partial view from above of an optoelectronic device 1 similar to that illustrated in FIG. 2A, in which device the structured portion 11 is no longer a suspended membrane but rather makes contact with the carrier layer 2. The tensioning arms 30 and the biasing arms 40 are therefore separate, in the XY plane, from the peripheral portion 12. The central segment 20 then rests on the carrier layer 2, which may comprise a waveguide that is located under the central segment 20 and optically coupled by evanescent waves therewith. In the case of hydrophilic direct bonding, a layer made of a silicon oxide may be located at the interface between the carrier layer 2 and the semiconductor layer 10, which then participates in the electrical insulation between these elements without however disrupting the optical coupling thereof.

FIGS. 7B and 7C are schematic and partial views in cross section along the transverse axis A2 of optoelectronic devices similar to that illustrated in FIG. 2A, in which devices the semiconductor layer 10 comprises a sublayer 10.1 of germanium obtained from a GeOI substrate. The sacrificial layer 3 is then made of a silicon oxide and the carrier layer 2 is made of silicon. Moreover, the structured portion 11 of the semiconductor layer 10 is a membrane that is suspended above the carrier layer 2.

In the example of FIG. 7B, the semiconductor layer 10 comprises an upper sublayer 10.2 based on GeSn, which continuously covers a lower sublayer 10.1 of Ge. The lower sublayer 10.1 may be made of intrinsic Ge, and the upper sublayer 10.2 based on GeSn may be doped in the main portions 41 of the biasing arms 40, and optionally in the joining portions 42. It is preferably unintentionally doped in the central segment 20. The connection pads 6 rest on and in contact with the doped regions of the upper sublayer 10.2 based on GeSn. As a variant, the lower sublayer 10.1 made of Ge may be locally etched, at least in the central segment 20, for example by ICP (inductively coupled plasma) RIE (reactive ion etching) in CF$_4$. As another variant, a first connection pad 6 may rest in contact with the sublayer 10.2, for example on a main portion 41, and the second connection pad 6 may rest in contact with the sublayer 10.2, for example on a main portion 41.

In the example of FIG. 7C, the lower sublayer 10.1 of Ge is doped in the main portions 41 of the biasing arms 40, and optionally in the joining portions 42. It is preferably unintentionally doped in the central segment 20. The upper sublayer 10.2 based on GeSn was locally etched so that it covers only the central segment 20, the joining portions 42 and a region of the main portion 41 of the biasing arms 40. It is preferably unintentionally doped. Furthermore, the connection pads 6 rest on and in contact with doped regions of the lower sublayer 10.1 of Ge. As a variant, the lower sublayer 10.1 made of Ge may be locally etched at least in the central segment 20.

As a variant, the semiconductor layer 10 may not be obtained from a GeOI substrate, but may rest on an SOI substrate. Thus, in the context of the two examples of FIGS. 7B and 7C, the Ge sublayer rests on a thin silicon layer, which rests on the sacrificial layer 3 made of a silicon oxide. This thin silicon layer may extend continuously through the structured portion 11 of the semiconductor layer 10, or may be locally etched at least in the central segment 20.

Particular embodiments have just been described. Various variants and modifications will appear obvious to those skilled in the art.

The invention claimed is:

1. An optoelectronic device, comprising:
   a semiconductor layer based on a crystalline semiconductor, comprising
      a central segment,
      which has a shape that is elongate along a longitudinal axis, of length along the longitudinal axis larger than its average width,
      which is tensilely strained along the longitudinal axis, and
      which comprises an active region for emitting or detecting light radiation;
   at least two first lateral segments forming tensioning arms,
      which are opposite one another with respect to the central segment along the longitudinal axis and extend from the central segment, and
      which have an average width larger than the average width of the central segment, so as to tensilely strain the central segment along the longitudinal axis;
   at least two connection pads, which are configured to apply an electrical bias to the central segment;
   wherein the semiconductor layer furthermore comprises:
      at least two second lateral segments forming biasing arms,
      which are opposite one another with respect to the central segment along a transverse axis oriented orthogonally to the longitudinal axis and extend from the central segment, each comprising:
         a main portion, which makes electrical contact with one of the connection pads, the main portions of the biasing arms being doped opposite conductivity types,
         a plurality of joining portions, which are separate from one another along the longitudinal axis and link the main portion to the central segment,
   wherein said device is suitable for emitting light radiation at a wavelength λ, wherein the joining portions are arranged along the longitudinal axis periodically, the period p of the arrangement of the joining portions along the longitudinal axis being shorter than the wavelength λ.

2. The optoelectronic device as claimed in claim 1, wherein the crystalline semiconductor in the tensioning arms is intrinsic.

3. The optoelectronic device as claimed in claim 1, wherein a ratio of the width of the joining portions along the longitudinal axis to a distance separating two adjacent joining portions along the longitudinal axis, and the ratio of the period p to the wavelength λ, are such that the joining portions form optical reflectors defining an optical cavity with respect to an optical mode of wavelength λ supported by the central segment.

4. The optoelectronic device as claimed in claim 1, wherein the central segment has a direct electronic band structure.

5. The optoelectronic device as claimed in claim 1, wherein the semiconductor layer is based on germanium.

6. The optoelectronic device as claimed in claim 1, wherein the connection pads rest on and in contact with the main portions of the biasing arms.

7. The optoelectronic device as claimed in claim 1, wherein the semiconductor layer comprises a portion called the structured portion and a portion called the peripheral portion, the structured portion being formed from the central segment, from the tensioning arms and from the biasing arms, the structured portion being a membrane that is suspended above a carrier layer, or that makes contact with the carrier layer while being distinct therefrom in a plane parallel to the carrier layer.

8. An optoelectronic device, comprising:
a semiconductor layer based on a crystalline semiconductor, comprising
  a central segment,
    which has a shape that is elongate along a longitudinal axis, of length along the longitudinal axis larger than its average width,
    which is tensilely strained along the longitudinal axis, and
    which comprises an active region for emitting or detecting light radiation:
  at least two first lateral segments forming tensioning arms,
    which are opposite one another with respect to the central segment along the longitudinal axis and extend from the central segment, and
    which have an average width larger than the average width of the central segment, so as to tensilely strain the central segment along the longitudinal axis:
at least two connection pads, which are configured to apply an electrical bias to the central segment;
wherein the semiconductor layer furthermore comprises:
  at least two second lateral segments forming biasing arms,
    which are opposite one another with respect to the central segment along, a transverse axis oriented orthogonally to the longitudinal axis and extend from the central segment, each comprising:
      a main portion, which makes electrical contact with one of the connection pads, the main portions of the biasing arms being doped opposite conductivity types,
      a plurality of joining portions, which are separate from one another along the longitudinal axis and link the main portion to the central segment,
wherein the joining portions have a curved junction with the central segment, with a radius of curvature equal, to within 10%, to half a distance separating two adjacent joining portions along the longitudinal axis.

9. An optoelectronic device, comprising:
a semiconductor layer based on a crystalline semiconductor, comprising
  a central segment,
    which has a shape that is elongate along a longitudinal axis, of length along the longitudinal axis larger than its average width,
    which is tensilely strained along the longitudinal axis, and
    which comprises an active region for emitting or detecting light radiation;
  at least two first lateral segments forming tensioning arms,
    which are opposite one another with respect to the central segment along the longitudinal axis and extend from the central segment, and
    which have an average width larger than the average width of the central segment, so as to tensilely strain the central segment along the longitudinal axis:
at least two connection pads, which are configured to apply an electrical bias to the central segment;
wherein the semiconductor layer furthermore comprises:
  at least two second lateral segments forming biasing arms,
    which are opposite one another with respect to the central segment along a transverse axis oriented orthogonally to the longitudinal axis and extend from the central segment, each comprising:
      a main portion, which makes electrical contact with one of the connection pads, the main portions of the biasing arms being doped opposite conductivity types,
      a plurality of joining portions, which are separate from one another along the longitudinal axis and link the main portion to the central segment,
wherein the biasing arms each comprise:
  a continuous portion, which is separate from the central segment, extends longitudinally along the longitudinal axis and links the joining portions to one another; and
  at least one intermediate portion linking the main portion to the continuous portion, the intermediate portion having a length and a width smaller than those of the corresponding main portion, so that the biasing arms induce in the central segment a tensile strain oriented along the transverse axis.

* * * * *

UNITED STATES PATENT AND TRADEMARK OFFICE
CERTIFICATE OF CORRECTION

PATENT NO. : 11,165,225 B2
APPLICATION NO. : 16/866630
DATED : November 2, 2021
INVENTOR(S) : Reboud et al.

It is certified that error appears in the above-identified patent and that said Letters Patent is hereby corrected as shown below:

On the Title Page

On Page 2, Column 2, item (56), under "OTHER PUBLICATIONS", Line 4, delete "Petykiemicz," and insert -- Petykiewicz, --, therefor.

In the Claims

In Column 19, Claim 8, Line 28, delete "radiation:" and insert -- radiation; --, therefor.

In Column 19, Claim 8, Line 36, delete "axis:" and insert -- axis; --, therefor.

In Column 19, Claim 8, Line 43, delete "along," and insert -- along --, therefor.

In Column 20, Claim 9, Line 23, delete "axis:" and insert -- axis; --, therefor.

Signed and Sealed this
Nineteenth Day of April, 2022

Katherine Kelly Vidal
*Director of the United States Patent and Trademark Office*